United States Patent [19]
Blalock

[11] Patent Number: 5,980,688
[45] Date of Patent: *Nov. 9, 1999

[54] PLASMA REACTORS AND METHOD OF CLEANING A PLASMA REACTOR

[75] Inventor: Guy Blalock, Boise, Id.

[73] Assignee: Micron Technology, Inc., Boise, Id.

[*] Notice: This patent is subject to a terminal disclaimer.

[21] Appl. No.: 09/107,928

[22] Filed: Jun. 30, 1998

Related U.S. Application Data

[63] Continuation of application No. 08/791,412, Jan. 30, 1997, Pat. No. 5,779,849, which is a continuation of application No. 08/450,392, May 25, 1995, Pat. No. 5,647,913, which is a division of application No. 08/253,115, Jun. 2, 1994, Pat. No. 5,514,246.

[51] Int. Cl.$^6$ .................................................. H05H 1/00
[52] U.S. Cl. .................. 156/345; 118/723 I; 204/298.34
[58] Field of Search ..................... 156/345; 118/723 I; 204/298.34, 298.31

[56] References Cited

U.S. PATENT DOCUMENTS

| | | | |
|---|---|---|---|
| 3,616,461 | 10/1971 | Gorin | 204/312 |
| 4,486,461 | 12/1984 | Ito et al. | 427/38 |
| 4,786,352 | 11/1988 | Benzing | 156/643 X |
| 4,786,392 | 11/1988 | Kruchowski et al. | 156/345 X |
| 4,795,880 | 1/1989 | Hayes et al. | 219/121.52 |
| 5,234,529 | 8/1993 | Johnson | 156/345 |
| 5,252,178 | 10/1993 | Moslehi | 156/643 |
| 5,269,881 | 12/1993 | Sekiya et al. | 156/643 |
| 5,277,751 | 1/1994 | Ogle | 156/643 |
| 5,346,578 | 9/1994 | Benzing et al. | 156/345 |
| 5,433,812 | 7/1995 | Cuomo et al. | 156/345 |
| 5,449,432 | 9/1995 | Hanawa | 156/643.1 |
| 5,523,261 | 6/1996 | Sandhu | 437/228 |
| 5,647,913 | 7/1997 | Blalock | 118/723 I |

*Primary Examiner*—Thi Dang
*Attorney, Agent, or Firm*—Wells, St. John, Roberts, Gregory, Matkin, P.S.

[57] ABSTRACT

A plasma reactor includes, a) an electrically insulative shell forming a reactor cavity, the reactor cavity having internal walls; b) inductive coils positioned externally of the cavity; and c) a capacitive coupling plate positioned externally of the cavity intermediate the cavity and inductive coils, a power source being operably connected with the capacitive coupling plate. A method of cleaning away material adhering to internal walls of a plasma reactor includes, a) injecting a cleaning gas into the reactor, the cleaning gas comprising a species which when ionized is reactive with material adhering to the internal plasma reactor walls; and b) generating a capacitive coupling effect between a pair of conductors, at least one of which is positioned externally of the plasma reactor, effective to both ionize the cleaning gas into the reactive ionized species and draw such ionized species in the direction of the external conductor to impact and clean away material adhering to the reactor internal walls. A combination dry etching and cleaning process is also disclosed.

17 Claims, 2 Drawing Sheets

1

PLASMA REACTORS AND METHOD OF CLEANING A PLASMA REACTOR

CROSS REFERENCE TO RELATED APPLICATION

This Patent resulted from a continuation application of U.S. patent application Ser. No. 08/791,412, filed Jan. 30, 1997, now U.S. Pat. No. 5,779,843, and titled "Plasma Reactors and Method of Cleaning a Plasma Reactor", which in turn is a continuation of U.S. patent application Ser. No. 08/450,392, filed May 25, 1995, now U.S. Pat. No. 5,647,913, which in turn is a divisional application of U.S. patent application Ser. No. 08/253,115, filed Jun. 2, 1994, now U.S. Pat. No. 5,514,246.

TECHNICAL FIELD

This invention relates to plasma reactors and to methods of cleaning plasma reactors.

BACKGROUND OF THE INVENTION

Chemical vapor deposition (CVD) is defined as the formation of a non-volatile solid film on a substrate by the reaction of vapor phase reactants that contain desired components. The gases are introduced into a reactor vessel, and decompose and reacted at a heated surface on the wafer to form the desired film. CVD is but one process of providing thin films on semiconductor wafers, such as films of elemental metals or compounds. It is a favored deposition process in many respects, principally because of its ability to provide highly conformal layers even within deep contacts and other openings.

CVD is generally classified into one of three types. The first two are principally predicated upon reactor pressure, and are designated as atmospheric pressure chemical vapor deposition (APCVD) or low pressure chemical vapor deposition (LPCVD).

A third category is referred to as plasma enhanced chemical vapor deposition (PECVD). Rather than relying solely on thermal energy to initiate and sustain chemical reactions, PECVD uses a radio frequency (RF) induced glow discharge to transfer energy into the reactant gases, allowing the substrate to remain at lower temperature than in APCVD or LPCVD processes. Specifically, the plasma-inducing glow discharge is generated by the application of an RF field to a low pressure gas, thereby creating free- electrons within the discharge region. The electrons gain sufficient energy from the electric field so that when they collide with gas molecules, gas-phase dissociation and ionization of the reactant gases (i.e., inducement into the plasma state) then occurs. Lower substrate temperature is the major advantage of PECVD, and provides a method of depositing films on some substrates which do not have the thermal stability to accept coating by other methods. In addition, PECVD can enhance the deposition rate when compared to thermal reactions alone, and produces films of unique compositions and properties.

One type of PECVD reactor employs a quartz reactor shell having electrically conductive inductive coils circling externally thereabout. A second electrode is received internally within the quartz shell, enabling inductive coupling to generate plasma inside of the reactor shell. Inductive coupling of power to generate the plasma refers to the transmission of power via electromagnetic radiation into the closed reactor volume having gas present therein at low pressure. The characteristics of such power transfer are very low mean ion energy, very high plasma density, and very little ion acceleration to the quartz walls. Inductive sources are very efficient in the low pressure regime, and are favored for small geometry definition.

In most inductively coupled PECVD processes, it is desirable to shield the internal reactor volume from capacitive electrostatic charge. Such is typically accomplished by the placement of an metal electrostatic shield intermediate the reactor cavity and inductive coils. Such a shield typically constitutes a metal plate having holes or elongated slots provided therethrough which shields the reactor cavity from capacitive electrostatic charge during semiconductor wafer processing. To function in this manner, such shield must be provided at ground potential, and accordingly these shields are permanently connected to ground.

An alternate technique for generating plasma is by capacitive coupling. Here, capacitive electrostatic charge is purposefully utilized to create strong electric fields at the electrode locations, which in turn creates a plasma sheath region. This type of power generation has the characteristic of heavy ion acceleration toward the negative electrode and very low plasma density. Plasma generation in this manner is typically utilized in dry chemical etching. As opposed to deposition as in CVD processes, plasma enhanced dry chemical etching utilizes ions to attack undesired material on a semiconductor wafer and thereby etch it from the wafer.

One major disabling drawback with most plasma etch or plasma deposition processes is the deposition of undesired material onto the internal quartz reactor walls. In PECVD, the material generated for deposition deposits not only on the semiconductor wafer positioned therein for processing, but everywhere within the reactor. Likewise with plasma etching, the material etched from the wafer and the products of the gas discharge will coat the internal reactor walls as opposed to being entirely pumped from the reactor. These wall-adhering materials can be very chemically stable, and thus are not easily removed by simple dry chemical etching techniques.

It would be desirable to overcome these drawbacks in the development of improved plasma reactors, and methods for cleaning plasma reactors.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
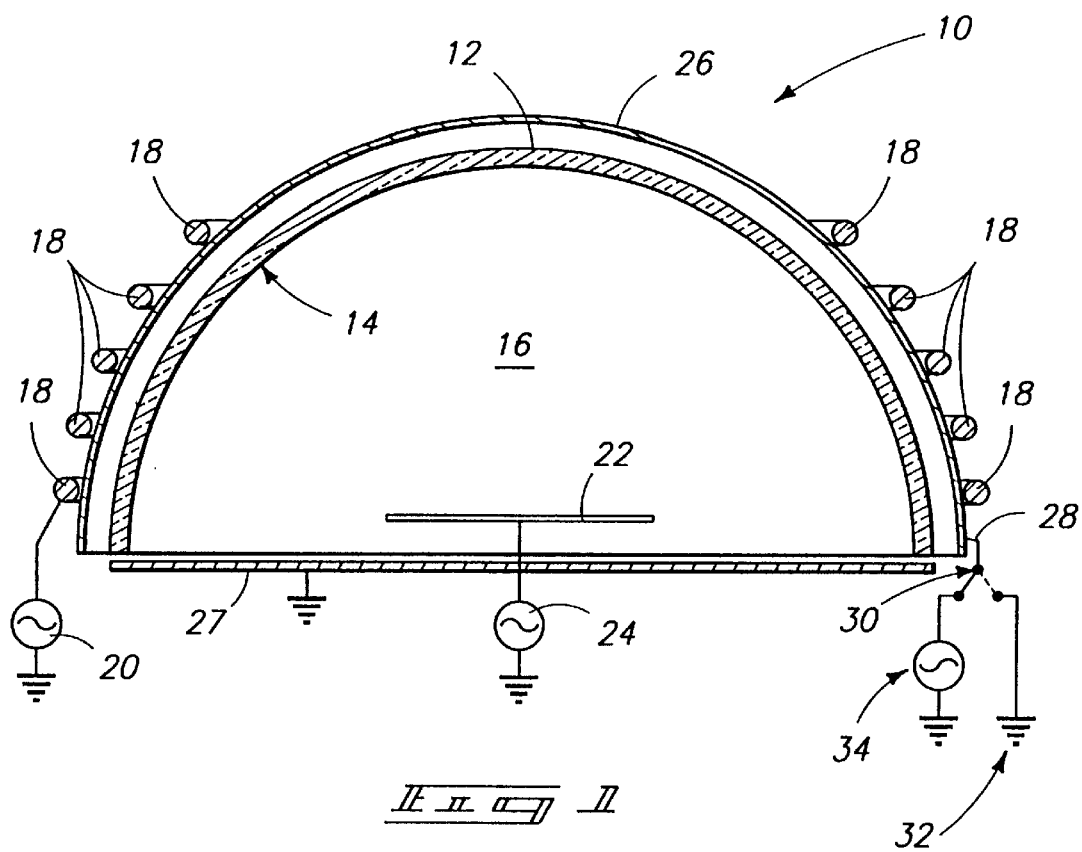
FIG. 1 is a diagrammatic sectional view of a plasma reactor apparatus in accordance with an aspect of the invention.

This disclosure of the invention is submitted in furtherance of the constitutional purposes of the U.S. Patent Laws "to promote the progress of science and useful arts" (Article 1, Section 8).

In accordance with one aspect of the invention, a plasma reactor apparatus comprises:

an electrically insulative shell forming a reactor cavity, the reactor cavity having internal walls;

inductive coupling means positioned externally of the cavity for inductively generating and transmitting electromagnetic radiation into the reactor cavity to ionize gas therein into a plasma state; and capacitive coupling means positioned externally of the cavity for capacitively generating and transmitting electromagnetic radiation into the reactor cavity to ionize gas therein into a plasma state, and for drawing plasma ions in the direction of the capacitive coupling means to impact and clean material adhering to the reactor cavity internal walls.

In accordance with another aspect of the invention, a method of cleaning away material adhering to internal walls of a plasma reactor comprises the following steps:

injecting a cleaning gas into the reactor, the cleaning gas comprising a species which when ionized is reactive with material adhering to the internal plasma reactor walls; and generating a capacitive coupling effect between a pair of conductors, at least one of which is positioned externally of the plasma reactor, effective to both ionize the cleaning gas into the reactive ionized species and draw such ionized species in the direction of the external conductor to impact and clean away material adhering to the reactor internal walls.

In accordance with still a further aspect of the invention, a method of cleaning away material adhering to internal walls of a plasma reactor and of dry etching a semiconductor wafer, comprises the following steps:

positioning a wafer to be dry etched into a plasma reactor cavity;

with the wafer so positioned, injecting an etching gas into the reactor cavity;

with the wafer so positioned, applying electrical current to inductive coils positioned externally of the reactor cavity to ionize etching gas therein into a plasma state;

with the wafer so positioned, providing an electrostatic barrier plate between the cavity and inductive coils at ground potential to shield the reactor cavity from capacitive electrostatic charge during etching;

after etching the wafer with the ionized etching gas, removing the wafer from the plasma reactor;

with the wafer removed, injecting a cleaning gas into the reactor, the cleaning gas comprising a species which when ionized is reactive with material adhering to the internal plasma reactor walls; and applying radio frequency power to the electrostatic barrier plate to produce an electrostatic capacitive coupling effect between the electrostatic barrier plate and another conductor which is effective to both ionize the cleaning gas into the reactive ionized species and draw such ionized species in the direction of the external conductor to impact and clean away material adhering to the reactor internal walls.

Figure 2:
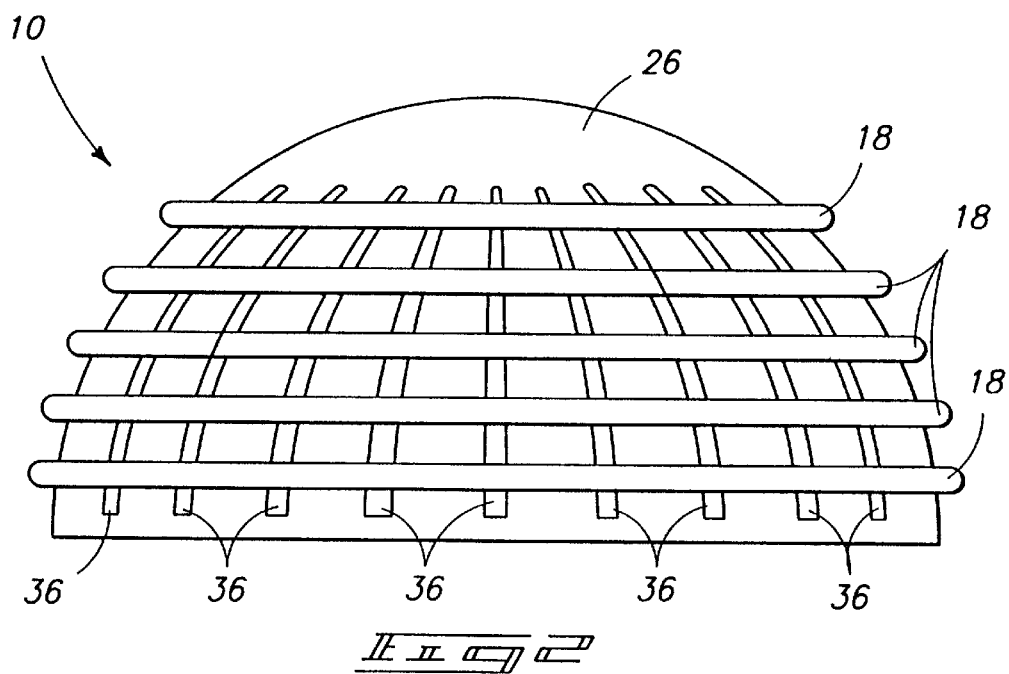
FIG. 2 is a diagrammatic side elevational view of the FIG. 1 apparatus.

More particularly and first with reference to FIGS. 1 and 2, a plasma reactor apparatus in accordance with the invention is indicated generally by reference numeral 10. Such comprises an electrically insulative shell 12 having internal walls 14. Walls 14 define an internal reactor cavity 16. An example material of construction for shell 12 would be quartz.

Electrically conductive inductive coils 18 are positioned externally of cavity 16 and shell 12, and wrap therearound. Inductive coils 18 constitute an inductive coupling means positioned externally of cavity 16 for inductively generating and transmitting electromagnetic radiation into reactor cavity 16 to ionize gases therein into a plasma state. Coils 18 are powered by a suitable conventional power supply 20. An example power supply would be 13.56 mHz and 3000 watts. An internal electrode 22 is utilized for supporting a wafer (not shown), and is as well connected to a conventional capacitively coupled bias power source 24 which would be utilized when anisotropically etching.

A capacitive coupling plate 26 is positioned externally of cavity 16 and shell 12 intermediate cavity 16 and inductive coils 18. Capacitive coupling plate 26 is connected via a conductive line 28 to a switch 30. Switch 30 is operable to connect plate 26 to one of a ground source/potential 32 or a power source 34. Power source 34 would be configured for operating at a frequency from 100 kHz to 60 mHz. Line 28, switch 30 and power supply 34 comprise a capacitive coupling means positioned externally of cavity 16 for capacitively generating and transmitting electromagnetic radiation into the reactor cavity to ionize gas therein into a plasma state, and for drawing plasma ions in the direction of the capacitive coupling means to impact and clean material adhering to reactor cavity internal walls 14. Such provides but one example of a capacitive coupling means. Others are of course also contemplated in accordance with the invention. By way of example only, capacitive coupling means may be provided wherein plate 26 is positioned other than intermediate cavity 16 and coils 18.

Capacitive coupling plate 26 is provided with a series of slot openings 36 (FIG. 2). Accordingly, such has a desired ability to also function as an electrostatic shielding means. When switch 30 connects line 28 to ground 32, plate 26 functions as an electrostatic shield plate. When switch 30 connects conductor 28 through power supply 34, plate 26 operates as a capacitive coupling means for ionizing and drawing gases to clean walls 14 of reactor shell 12.

A method of cleaning away material adhering to internal walls 14 could be conducted as follows. A cleaning gas would be injected into reactor cavity 16. Such would include a species which, when ionized, would be reactive with material adhering to internal plasma reactor walls 14. For example where the material being cleaned from walls 14 comprises $SiO_2$, an example species within the cleaning gas would comprise a fluorine gas selected from the group consisting of $NF_3$, $SF_6$ or $CF_4$. An example flow rate would be from 50 standard cubic centimeters per minute (sccm) to 1,000 sccm for a 5-liter volume for cavity 16.

While injecting such gases, a capacitive coupling effect would be generated between plate 26 and conductor 22 and any other grounded areas of the reactor assembly, such as the illustrated metal lower reactor housing 27. The capacitive coupling effect would be effective to both ionize the injected cleaning gases into desired reactive ionized fluorine species, and to draw such ionized species in the direction of external conductor 26, thereby impacting and cleaning away material adhering to reactor internal walls 14. The preferred frequency for the power would be from 100 kHz to 60 mHz, with an example power for a 5-liter reactor using the above flow rates being 1000 watts. Cleaning time would be determined based upon the quantity of material adhering to reactor sidewalls 14.

It might also be desirable to simultaneously generate an inductive coupling effect by powering conductive coils 18 to inductively transmit electromagnetic radiation into reactor cavity 16 while the capacitive coupling effective is also being produced. Such might further facilitate ionization of gases therein, which would be strongly attracted to the sidewalls via the capacitive coupling effect produced by powering plate 26. An example power for coils 18 during such an event would be 2000 watts at 13.56 mHz.

The above-described reactor and method could be used both in the context of PECVD reactors, dry etching reactors and with other plasma reactors. For example with respect to dry etching a semiconductor wafer, suitable etching gases would be injected within cavity 16 and inductive coils 18 powered to induce plasma within cavity 16. Line 28 extending from plate 26 would be switched to ground 32. Thereby, cavity 16 is shielded from capacitive electrostatic charge during plasma enhanced dry chemical etching. After etching the wafer with the ionized etching gas, the wafer would be removed from the reactor. Thereafter, the reactor would be operated as described above (i.e., power applied to reactor plate 26 from power source 34) in a manner and with a cleaning gas effective to clean internal reactor walls 14. If desired, a dummy protective wafer might be positioned within the reactor to protect electrode 22.

Figure 3:
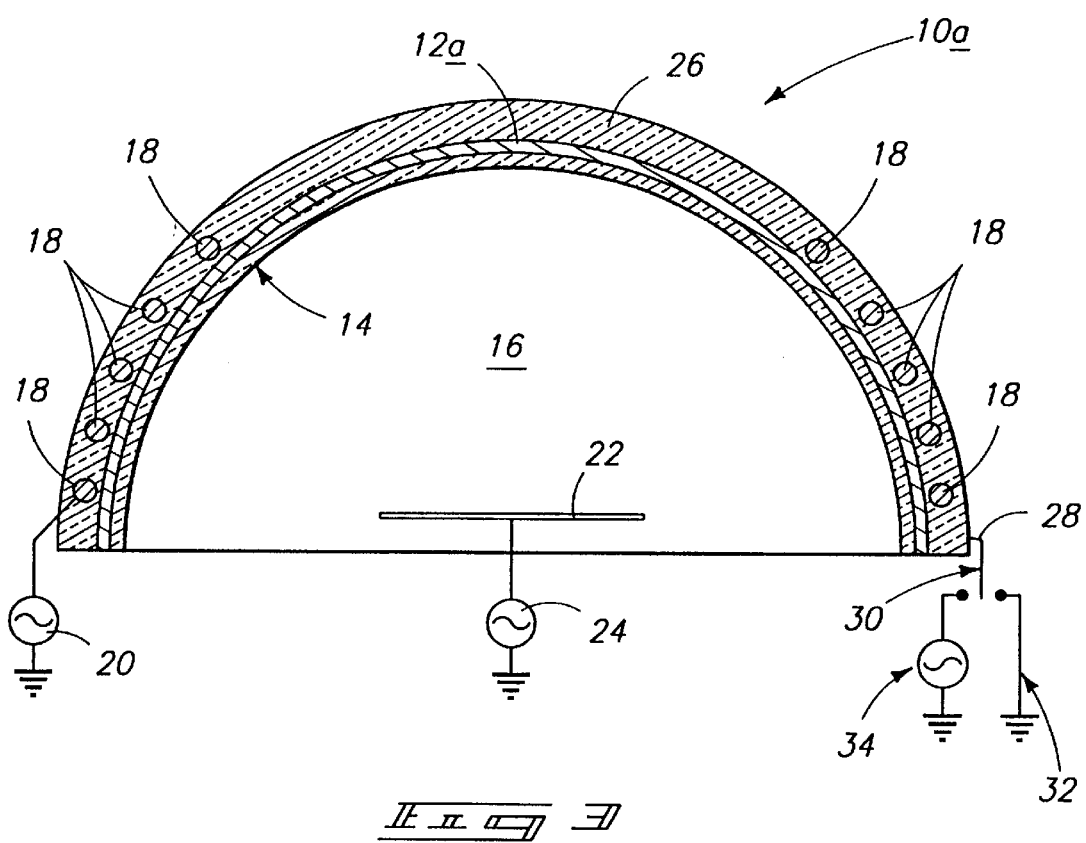
FIG. 3 is a diagrammatic sectional view of an alternate embodiment plasma reactor apparatus in accordance with the invention.

FIG. 3 illustrates an alternate embodiment plasma reactor apparatus 10a. Such is similar to the above-described reactor 10, but for formation of a substantially thicker quartz reactor shell 12a. Inductive coils 18 and capacitive coupling plate 26 are embedded within shell 12a, and thus are internally positioned relative thereto.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A plasma reactor comprising:
   a reactor cavity having internal walls;
   an inductive coil positioned externally of the cavity configured to inductively generate and transmit electromagnetic radiation into the reactor cavity to ionize gas therein into a plasma state; and
   a capacitive plate positioned externally of the cavity, and switchable between a first mode wherein, in operation, the plate capacitively generates and transmits electromagnetic radiation into the reactor cavity to ionize gas therein into a plasma state and draws plasma ions in the direction of the capacitive plate to impact and clean material adhering to the reactor cavity internal walls; and a second mode wherein, in operation, the capacitive plate shields the reactor cavity from capacitive electrostatic charge during semiconductor wafer processing, the capacitive plate being switchable between a grounded condition and a conductively powered condition.

2. The plasma reactor of claim 1 wherein the capacitive plate is positioned intermediate the cavity and inductive coil.

3. A plasma reactor comprising:
   a reactor cavity having internal walls;
   an inductive coupling coil positioned externally of the cavity to inductively generate and transmit electromagnetic radiation into the reactor cavity to ionize gas therein into a plasma state, the inductive coupling coil comprising conductive coils which are externally positioned relative to the insulative shell;
   a capacitive plate positioned externally of the cavity to capacitively generate and transmit electromagnetic radiation into the reactor cavity to ionize gas therein into a plasma state, and to draw plasma ions in the direction of the capacitive plate to impact and clean material adhering to the reactor cavity internal walls, the capacitive plate being switchable between a grounded condition in which the capacitive plate shields the reactor cavity from capacitive electrostatic charge, and a conductively powered condition the plate having openings therethrough, and the plate being externally positioned relative to the reactor shell and intermediate the coil and the cavity; and
   a switch coupled to the capacitive coupling plate to switch the capacitive coupling plate between the grounded condition and the conductively powered condition.

4. A plasma reactor comprising:
   an electrically insulative shell forming a reactor cavity, the reactor cavity having internal walls;
   inductive coils positioned externally of the reactor cavity to ionize gas therein into a plasma state;
   a capacitive coupling plate positioned externally of the cavity intermediate the cavity and inductive coils; and
   a frequency generator selectively operably connected with the capacitive coupling plate to cause the capacitive coupling plate to draw plasma ions in the direction of the capacitive coupling plate to impact and clean the internal walls of the reactor cavity.

5. The plasma reactor of claim 4 wherein the inductive coils are externally positioned relative to the insulative shell.

6. The plasma reactor of claim 4 wherein the capacitive coupling plate is externally positioned relative to the insulative shell.

7. The plasma reactor of claim 4 wherein the inductive coils are externally positioned relative to the insulative shell, and the capacitive coupling plate is externally positioned relative to the reactor shell.

8. The plasma reactor of claim 7 wherein the inductive coils are embedded within the insulative shell.

9. The plasma reactor of claim 4 wherein the capacitive coupling plate is embedded within the insulative reactor shell.

10. The plasma reactor of claim 4 wherein the inductive coils are embedded within the insulative shell, and the capacitive coupling plate is embedded within the insulative shell.

11. The plasma reactor of claim 4 wherein the inductive coils are positioned externally relative to the insulative shell, and the capacitive coupling plate is externally positioned relative to the insulative shell; and
    the capacitive coupling plate has openings provided therethrough and is switchable between a grounded condition in which the capacitive coupling plate shields the reactor cavity from capacitive electrostatic charge and a conductively powered condition.

12. The plasma reactor of claim 4 wherein the frequency generator is configured for an operating frequency of from 100 kHz to 60 MHz.

13. A plasma reactor comprising:
    shell means for defining a reactor cavity having internal walls;
    inductive means positioned externally of the shell means and for inductively generating and transmitting electromagnetic radiation into the reactor cavity for ionizing gas in the reactor cavity into a plasma state, the inductive means being externally positioned relative to the shell means;
    capacitive shielding means positioned externally of the cavity for shielding the reactor cavity from capacitive electrostatic charge during semiconductor wafer processing;

means for providing power at an operating frequency of from 100 kHz to 60 MHz;

capacitive cleaning means positioned externally of the cavity for capacitively generating and transmitting electromagnetic radiation into the reactor cavity to ionize gas therein into a plasma state, and for drawing plasma ions in the direction of the capacitive coupling means to impact and clean material adhering to the reactor cavity internal walls, the capacitive coupling means and capacitive shielding means comprising a dual function conductive plate switchable between a grounded condition in which the capacitive coupling plate shields the reactor cavity from capacitive electrostatic charge and a conductively powered condition in which the capacitive coupling plate is connected to the power source to ionize gas into a plasma state and draw plasma ions into the direction of the conductive plate, the conductive plate having openings therethrough, and the conductive plate being externally positioned relative to the reactor shell and intermediate the conductive coils and the insulative shell; and means for selectively switching the dual function conductive plate between the grounded condition and the conductively powered condition.

14. A plasma reactor comprising:

an electrically insulative shell forming a reactor cavity, the reactor cavity having internal walls;

inductive coils positioned externally of the insulative shell;

a dual function capacitive coupling plate positioned externally of the insulative shell intermediate the insulative shell and the inductive coils;

a power source; and a switch selectively connecting the capacitive coupling plate to a ground potential during semiconductor wafer processing, wherein the capacitive coupling plate shields the reactor cavity from capacitive electrostatic charge, and selectively connecting the capacitive coupling plate to the power source during cleaning.

15. A plasma reactor comprising:

an electrically insulative shell forming a reactor cavity, the reactor cavity having internal walls;

inductive coils positioned within the insulative shell, externally of the cavity;

a dual function capacitive coupling plate positioned externally relative to the cavity and the inductive coils, the capacitive coupling plate having a plurality of slot openings provided therethrough;

a power source; and a switch selectively connecting the capacitive coupling plate to a ground potential during semiconductor wafer processing, wherein the capacitive coupling plate shields the reactor cavity from capacitive electrostatic charge, and selectively connecting the capacitive coupling plate to the power source during cleaning.

16. The plasma reactor of claim 15 wherein the capacitive coupling plate has openings provided therethrough is switchable between a grounded condition and a conductively powered condition.

17. The plasma reactor of claim 15 wherein the capacitive coupling plate is switchable between a grounded condition and a conductively powered condition.

* * * * *

UNITED STATES PATENT AND TRADEMARK OFFICE
CERTIFICATE OF CORRECTION

PATENT NO.    : 5,980,688
DATED         : November 9, 1999
INVENTOR(S)   : Guy Blalock It is certified that error appears in the above-identified patent and that said Letters Patent is hereby corrected as shown below:

Column 1, line 9, replace "U.S. Patent No. 5,779,843" with --U.S. Patent No. 5,779,849--.

Column 6, line 34, Claim 8, replace "claim 7" with --claim 4--.

Signed and Sealed this

Ninth Day of May, 2000

Attest:

Q. TODD DICKINSON

*Attesting Officer*         *Director of Patents and Trademarks*